US009564736B1

(12) United States Patent
Hsu et al.

(10) Patent No.: US 9,564,736 B1
(45) Date of Patent: Feb. 7, 2017

(54) EPITAXIAL GROWTH OF P-TYPE CLADDING REGIONS USING NITROGEN GAS FOR A GALLIUM AND NITROGEN CONTAINING LASER DIODE

(71) Applicant: Soraa Laser Diode, Inc., Goleta, CA (US)

(72) Inventors: Po Shan Hsu, Arcadia, CA (US); Melvin McLaurin, Goleta, CA (US); Thiago P. Melo, Fremont, CA (US); James W. Raring, Goleta, CA (US)

(73) Assignee: SORAA LASER DIODE, INC., Goleta, CA (US)

( * ) Notice: Subject to any disclaimer, the term of this patent is extended or adjusted under 35 U.S.C. 154(b) by 69 days.

(21) Appl. No.: 14/315,687

(22) Filed: Jun. 26, 2014

(51) Int. Cl.
  *H01S 5/20* (2006.01)
  *H01S 5/22* (2006.01)
  *H01S 5/32* (2006.01)

(52) U.S. Cl.
  CPC .............. *H01S 5/20* (2013.01); *H01S 5/2031* (2013.01); *H01S 5/222* (2013.01); *H01S 5/3211* (2013.01);
  (Continued)

(58) Field of Classification Search
  CPC ........ H01S 5/20; H01S 5/3219; H01S 5/3218; H01S 5/2031; H01S 5/3215; H01S 5/3216; H01S 5/3211; H01S 5/3214; H01S 5/3213; H01S 5/222
  See application file for complete search history.

(56) References Cited

U.S. PATENT DOCUMENTS

| 4,341,592 A | 7/1982 | Shortes et al. |
| 4,860,687 A | 8/1989 | Frijlink |

(Continued)

FOREIGN PATENT DOCUMENTS

| JP | 2007-173467 A | 7/2007 |
| JP | 2007-068398 | 4/2008 |
| WO | 2008-041521 A1 | 4/2008 |

OTHER PUBLICATIONS

Abare "Cleaved and Etched Facet Nitride Laser Diodes," IEEE Journal of Selected Topics in Quantum Electronics, vol. 4, No. 3, pp. 505-509 (May 1998).

(Continued)

*Primary Examiner* — John P Dulka
(74) *Attorney, Agent, or Firm* — Kilpatrick Townsend & Stockton, LLP

(57) ABSTRACT

In an example, the present invention provides a method for fabricating a light emitting device configured as a Group III-nitride based laser device. The method also includes forming a gallium containing epitaxial material overlying the surface region of a substrate member. The method includes forming a p-type (Al,In,Ga)N waveguiding material overlying the gallium containing epitaxial material under a predetermined process condition. The method includes maintaining the predetermined process condition such that an environment surrounding a growth of the p-type (Al,In,Ga)N waveguide material is substantially a molecular $N_2$ rich gas environment. The method includes maintaining a temperature ranging from 725 C to 925 C during the formation of the p-type (Al,In,Ga)N waveguide material, although there may be variations. In an example, the predetermined process condition is substantially free from molecular $H_2$ gas.

22 Claims, 8 Drawing Sheets

(52) U.S. Cl.
CPC .......... *H01S 5/3213* (2013.01); *H01S 5/3214* (2013.01); *H01S 5/3215* (2013.01); *H01S 5/3216* (2013.01); *H01S 5/3218* (2013.01); *H01S 5/3219* (2013.01)

(56) References Cited

U.S. PATENT DOCUMENTS

| | | | |
|---|---|---|---|
| 4,911,102 A | 3/1990 | Manabe et al. | |
| 5,331,654 A | 7/1994 | Jewell et al. | |
| 5,334,277 A | 8/1994 | Nakamura | |
| 5,366,953 A | 11/1994 | Char et al. | |
| 5,527,417 A | 6/1996 | Lida et al. | |
| 5,607,899 A | 3/1997 | Yoshida et al. | |
| 5,632,812 A | 5/1997 | Hirabayashi | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 5,926,493 A | 7/1999 | O'Brien et al. | |
| 5,951,923 A | 9/1999 | Rorie et al. | |
| 6,069,394 A | 5/2000 | Hashimoto et al. | |
| 6,147,953 A | 11/2000 | Duncan | |
| 6,153,010 A | 11/2000 | Kiyoku et al. | |
| 6,239,454 B1 | 5/2001 | Glew et al. | |
| 6,379,985 B1 | 4/2002 | Cervantes et al. | |
| 6,451,157 B1 | 9/2002 | Hubacek | |
| 6,489,636 B1 | 12/2002 | Goetz et al. | |
| 6,586,762 B2 | 7/2003 | Kozaki | |
| 6,635,904 B2 | 10/2003 | Goetz et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,920,166 B2 | 7/2005 | Akasaka et al. | |
| 7,009,199 B2 | 3/2006 | Hall | |
| 7,033,858 B2 | 4/2006 | Chai et al. | |
| 7,053,413 B2 | 5/2006 | D'Evelyn et al. | |
| 7,063,741 B2 | 6/2006 | D'Evelyn | |
| 7,128,849 B2 | 10/2006 | Setlur et al. | |
| 7,220,324 B2 | 5/2007 | Baker et al. | |
| 7,303,630 B2 | 12/2007 | Motoki et al. | |
| 7,312,156 B2 | 12/2007 | Granneman et al. | |
| 7,323,723 B2 | 1/2008 | Ohtsuka et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,470,555 B2 | 12/2008 | Matsumura | |
| 7,483,466 B2 | 1/2009 | Uchida et al. | |
| 7,489,441 B2 | 2/2009 | Scheible et al. | |
| 7,555,025 B2 | 6/2009 | Yoshida | |
| 7,691,658 B2 | 4/2010 | Kaeding et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 8,017,932 B2 | 9/2011 | Okamoto et al. | |
| 8,044,412 B2 | 10/2011 | Murphy et al. | |
| 8,143,148 B1 | 3/2012 | Raring et al. | |
| 8,247,887 B1 | 8/2012 | Raring et al. | |
| 8,252,662 B1 | 8/2012 | Poblenz et al. | |
| 8,259,769 B1 | 9/2012 | Raring et al. | |
| 8,314,429 B1 | 11/2012 | Raring et al. | |
| 8,351,478 B2 | 1/2013 | Raring et al. | |
| 8,355,418 B2 | 1/2013 | Raring et al. | |
| 8,422,525 B1 | 4/2013 | Raring et al. | |
| 2002/0050488 A1 | 5/2002 | Nikitin et al. | |
| 2002/0085603 A1 | 7/2002 | Okumura | |
| 2002/0171092 A1 | 11/2002 | Goetz et al. | |
| 2003/0000453 A1 | 1/2003 | Unno et al. | |
| 2003/0001238 A1 | 1/2003 | Ban | |
| 2003/0012243 A1 | 1/2003 | Okumura | |
| 2003/0020087 A1 | 1/2003 | Goto et al. | |
| 2003/0140846 A1 | 7/2003 | Biwa et al. | |
| 2003/0216011 A1 | 11/2003 | Nakamura et al. | |
| 2004/0025787 A1 | 2/2004 | Selbrede et al. | |
| 2004/0060518 A1 | 4/2004 | Nakamura et al. | |
| 2004/0104391 A1 | 6/2004 | Maeda et al. | |
| 2004/0151222 A1 | 8/2004 | Sekine | |
| 2004/0196877 A1 | 10/2004 | Kawakami et al. | |
| 2004/0222357 A1 | 11/2004 | King et al. | |
| 2004/0247275 A1 | 12/2004 | Vakhshoori et al. | |
| 2004/0262624 A1 | 12/2004 | Akita et al. | |
| 2005/0023541 A1* | 2/2005 | Takeya .................. B82Y 20/00 257/79 |
| 2005/0040384 A1 | 2/2005 | Tanaka et al. | |
| 2005/0072986 A1 | 4/2005 | Sasaoka | |
| 2005/0168564 A1 | 8/2005 | Kawaguchi et al. | |
| 2005/0224826 A1 | 10/2005 | Keuper et al. | |
| 2005/0229855 A1 | 10/2005 | Raaijmakers | |
| 2005/0285128 A1 | 12/2005 | Scherer et al. | |
| 2006/0030738 A1 | 2/2006 | Vanmaele et al. | |
| 2006/0037529 A1 | 2/2006 | D'Evelyn | |
| 2006/0038193 A1 | 2/2006 | Wu et al. | |
| 2006/0060131 A1 | 3/2006 | Atanackovic | |
| 2006/0066319 A1 | 3/2006 | Dallenbach et al. | |
| 2006/0078022 A1 | 4/2006 | Kozaki et al. | |
| 2006/0079082 A1 | 4/2006 | Bruhns et al. | |
| 2006/0086319 A1 | 4/2006 | Kasai et al. | |
| 2006/0118799 A1 | 6/2006 | D'Evelyn et al. | |
| 2006/0126688 A1 | 6/2006 | Kneissl | |
| 2006/0144334 A1 | 7/2006 | Yim et al. | |
| 2006/0175624 A1 | 8/2006 | Sharma et al. | |
| 2006/0189098 A1 | 8/2006 | Edmond | |
| 2006/0193359 A1 | 8/2006 | Kuramoto | |
| 2006/0205199 A1 | 9/2006 | Baker et al. | |
| 2006/0216416 A1 | 9/2006 | Sumakeris et al. | |
| 2006/0256482 A1 | 11/2006 | Araki et al. | |
| 2006/0288928 A1 | 12/2006 | Eom et al. | |
| 2007/0081857 A1 | 4/2007 | Yoon | |
| 2007/0086916 A1 | 4/2007 | LeBoeuf et al. | |
| 2007/0093073 A1 | 4/2007 | Farrell et al. | |
| 2007/0110112 A1 | 5/2007 | Sugiura | |
| 2007/0120141 A1 | 5/2007 | Moustakas et al. | |
| 2007/0163490 A1 | 7/2007 | Habel et al. | |
| 2007/0166853 A1 | 7/2007 | Guenthe et al. | |
| 2007/0217462 A1 | 9/2007 | Yamasaki | |
| 2007/0242716 A1 | 10/2007 | Samal et al. | |
| 2007/0252164 A1 | 11/2007 | Zhong et al. | |
| 2007/0280320 A1 | 12/2007 | Feezell et al. | |
| 2008/0087919 A1 | 4/2008 | Tysoe et al. | |
| 2008/0092812 A1 | 4/2008 | McDiarmid et al. | |
| 2008/0095492 A1 | 4/2008 | Son et al. | |
| 2008/0121916 A1 | 5/2008 | Teng et al. | |
| 2008/0124817 A1 | 5/2008 | Bour et al. | |
| 2008/0149949 A1 | 6/2008 | Nakamura et al. | |
| 2008/0149959 A1 | 6/2008 | Nakamura et al. | |
| 2008/0164578 A1 | 7/2008 | Tanikella et al. | |
| 2008/0173735 A1 | 7/2008 | Mitrovic et al. | |
| 2008/0191192 A1 | 8/2008 | Feezle et al. | |
| 2008/0191223 A1 | 8/2008 | Nakamura et al. | |
| 2008/0198881 A1 | 8/2008 | Farrell et al. | |
| 2008/0210958 A1 | 9/2008 | Senda et al. | |
| 2008/0217745 A1 | 9/2008 | Miyanaga et al. | |
| 2008/0232416 A1 | 9/2008 | Okamoto et al. | |
| 2008/0285609 A1 | 11/2008 | Ohta et al. | |
| 2008/0291961 A1 | 11/2008 | Kamikawa et al. | |
| 2008/0303033 A1 | 12/2008 | Brandes | |
| 2008/0308815 A1 | 12/2008 | Kasai et al. | |
| 2008/0315179 A1 | 12/2008 | Kim et al. | |
| 2009/0058532 A1 | 3/2009 | Kikkawa et al. | |
| 2009/0078944 A1 | 3/2009 | Kubota et al. | |
| 2009/0080857 A1 | 3/2009 | St. John-Larkin | |
| 2009/0081857 A1 | 3/2009 | Hanser et al. | |
| 2009/0081867 A1 | 3/2009 | Taguchi et al. | |
| 2009/0141765 A1 | 6/2009 | Kohda et al. | |
| 2009/0159869 A1 | 6/2009 | Ponce et al. | |

(56) References Cited

U.S. PATENT DOCUMENTS

| | | |
|---|---|---|
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0177678 A1* | 7/2011 | Ohno ............... B82Y 20/00 438/478 |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0216795 A1 | 9/2011 | Hsu et al. |
| 2011/0247556 A1 | 10/2011 | Raring et al. |
| 2012/0213242 A1* | 8/2012 | Tanaka ............... B82Y 20/00 372/50.1 |
| 2013/0016750 A1* | 1/2013 | Raring ............ H01L 21/02389 372/45.01 |
| 2013/0234111 A1 | 9/2013 | Pfister et al. |
| 2013/0322481 A1* | 12/2013 | Bhat ............... H01L 21/02389 372/45.012 |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN—GaN laser grown on spinel substrates," Appl. Phys. Lett. 69 (16), pp. 2418-2420 (Oct. 14, 1996).

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Fuji et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based On InGaN Microfacet Quantum Wells toward Tailor-Made Solid-State Lighting," 2008, Applied Physics Express, vol. 1, pp. 011106-1-011106-3.

Founta et al., 'Anisotropic Morphology of Nonpolar a-Plane GaN Quantum Dots and Quantum Wells,' Journal of Applied Physics, vol 102, vol. 7, 2007, pp. 074304-1-074304-6.

Gardner et al. "Blue-emitting InGaN—GaN double-heterostructure light-emitting diodes reaching maximum quantum efficiency above 200 A/ cm2", Applied Physics Letters 91, 243506 (2007).

hap ://techon.nikkeibp. co jp/english/NEWS_EN/20080122/ 146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.

Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).

Park, "Crystal orientation effects on electronic properties of wurtzite InGaN/GaN quantum wells,",Journal of Applied Physics vol. 91, No. 12, pp. 9904-9908 (Jun. 2002).

Purvis, "Changing the Crystal Face of Gallium Nitride." The Advance Semiconductor Magazine, vol. 18, No. 8, Nov. 2005.

Romanov "Strain-induced polarization in wurtzite III-nitride semipolar layers," Journal of Applied Physics 100, pp. 023522-1 through 023522-10 (Jul. 25, 2006).

(56) References Cited

OTHER PUBLICATIONS

Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN-GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes On Semipolar (1011) Bulk GaN Substrates," 2007, Japanese Journal of Applied Physics, vol. 46, No. 7, pp. L129-L131.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields For Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yoshizumi et al. "Continuous-Wave operation of 520 nm Green InGaN-Based Laser Diodes on Semi-Polar {20-21} GaN Substrates," Applied Physics Express 2 (2009).
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode On Freestanding Semipolar (1122) Bulk GaN Substrate," 2007, Applied Physics Letter, vol. 90, No. 23, pp. 233504-233504-3.
International Search Report of PCT Application No. PCT/US2009/047107, dated Sep. 29, 2009, 4 pages.
International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion ofPCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
USPTO Office action for U.S. Appl. No. 12/873,820 dated Oct. 11, 2012.
USPTO Office action for U.S. Appl. No. 12/749,466 dated Feb. 3, 2012.
USPTO Office action for U.S. Appl. No. 13/046,565 dated Feb. 2, 2012.
USPTO Office action for U.S. Appl. No. 13/046,565 dated Nov. 7, 2011.
USPTO Office action for U.S. Appl. No. 12/484,924 dated Oct. 31, 2011.
USPTO Office action for U.S. Appl. No. 12/497,289 dated Feb. 2, 2012.
USPTO Office action for U.S. Appl. No. 12/759,273 dated Nov. 21, 2011.
USPTO Office action for U.S. Appl. No. 12/762,269 (Oct. 12, 2011).
USPTO Office action for U.S. Appl. No. 12/762,271 dated Dec. 23, 2011.
USPTO Office action for U.S. Appl. No. 12/778,718 dated Nov. 25, 2011.
USPTO Notice of Allowance for U.S. Appl. No. 12/762,278 dated Nov. 7, 2011.
USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12,2011.
USPTO Office Action for U.S. Appl. No. 12/484,924 dated Apr. 14,2011.
USPTO Office Action for U.S. Appl. No. 12/491,169 dated Oct. 22, 2010.
USPTO Office Action for U.S. Appl. No. 12/491,169 dated May 11, 2011.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/868,441 dated Apr. 30, 2012.
USPTO Office Action for U.S. Appl. No. 12/880,803 dated Feb. 22, 2012.

(56) References Cited

OTHER PUBLICATIONS

USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
USPTO Office Action for U.S. Appl. No. 12/884,993 dated Aug. 2, 16, 2012.
USPTO Notice of Allowance for U.S. Appl. No. 12/884,993 dated Nov. 26, 2012.
USPTO Office Action for U.S. Appl. No. 12/883,093 dated Mar. 13, 2012.
USPTO Office Action for U.S. Appl. No. 12/883,093 dated Aug. 3, 2012.
USPTO Notice of Allowance for U.S. Appl. No. 12/883,093 dated Nov. 21, 2012.
U.S. Appl. No. 61/249,568, filed Oct. 7, 2009, Raring et al. Unpublished.
U.S. Appl. No. 61/182,105, filed May 29, 2009, Raring, Unpublished.
U.S. Appl. No. 61/164,409, filed Mar. 28, 2009, Raring et al., Unpublished.
U.S. Appl. No. 12/573,820, filed Oct. 5, 2009, Raring et al., Unpublished.
U.S. Appl. No. 12/880,889, filed Sep. 13, 2010, Raring et al., Unpublished.
U.S. Appl. No. 12/727,148, filed Mar. 18, 2010, Raring, Unpublished.

\* cited by examiner

EPITAXIAL GROWTH OF P-TYPE CLADDING REGIONS USING NITROGEN GAS FOR A GALLIUM AND NITROGEN CONTAINING LASER DIODE

BACKGROUND

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lasers at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lasers at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high-end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application. Currently the only viable direct violet, blue, and green laser diode structures are fabricated from the wurtzite AlGaInN material system. However, limitations associated with III-nitride laser device epitaxial growth and fabrication are numerous and only become more severe with increased lasing wavelength. These and other limitations are described throughout the present specification and more particularly below.

From the above, improved techniques for manufacturing semiconductor laser diodes are highly desired.

SUMMARY

The invention is directed techniques, including a method of fabrication of optoelectronic devices from semiconductor wafers. In particular, the invention provides a method and device for emitting electromagnetic radiation using nonpolar or semipolar gallium containing substrates such as GaN, AN, InN, InGaN, AlGaN, AlInGaN, and others. In other examples, novel structures are also included. The invention provides a method and device using a gallium and nitrogen containing substrate of the wurtzite crystal structure configured on any of the (0001), {11-20}, {10-10}, {10-11}, {20-21} and {30-31} families of crystal planes or an offcut of any of these planes according to one or more embodiments, but there can be other configurations. For example, it is possible under certain circumstances to produce gallium and nitrogen containing substrates with zinc blende crystal structures which would be applicable under this invention. Still more particularly, this invention provides a method for processing small semiconductor wafers or non-standard size such that all multiple wafers can be processed in parallel at the majority of steps in the fabrication process. The invention can be applied to optical devices such as lasers and light emitting diodes, among other devices.

This current invention provides a method for producing low resistance, low optical loss epitaxially grown p-type (Al,In,Ga)N cladding material with low Mg-doping levels at low growth temperatures. Herein the p-type (Al,In,Ga)N cladding material is epitaxially grown on top of n-type (Al,In,Ga)N layers under $N_2$ ambient conditions or ambient conditions consisting of a mixture of $H_2$ and $N_2$ gases. Under conventional art, it is believed that $H_2$ (i.e., hydrogen gas) ambient conditions are often required for growth of high quality low-resistance p-type (Al,In,Ga)N cladding. Based on first principle calculations by Neugebauer et al. (Neugebauer APL 68, 1829 (1996)), growth of p-type GaN under $H_2$ rich conditions lowers defect concentration while increases acceptor dopant incorporation. Our method for producing p-type (Al,In,Ga)N cladding layers shows that $H_2$ ambient conditions are not necessary for achieving high quality p-type (Al,In,Ga)N material. In fact, under identical growth rates, p-type cladding material grown under $N_2$ ambient conditions are shown to have higher charge and lower sheet resistance compared to p-type (Al,In,Ga)N cladding material grown under $H_2$ ambient conditions when grown at sufficiently low temperatures. Low temperature p-type (Al,In,Ga)N cladding material growth is desirable for long wavelength emitters to prevent thermal degradation of the high indium composition active region. Higher performance p-type cladding material grown under $N_2$ ambient conditions is attributed to lower [C] impurity levels compared to p-type (Al,In,Ga)N cladding material grown under $H_2$ ambient conditions. In a preferred embodiment, the p-type (Al,In,Ga)N cladding material of an optoelectronic device is epitaxially grown under pure $N_2$ ambient conditions at sufficiently low temperatures as not to cause thermal degradation in the high InN fraction active region. In alternative embodiment, the p-type (Al,In,Ga)N cladding material of an optoelectronic device is epitaxially grown under a mixture of $N_2/H_2$ ambient conditions at sufficiently low temperatures as not to cause thermal degradation in the high InN fraction active region. In both embodiments, the Mg-doping in p-type (Al,In,Ga)N cladding material is kept sufficiently low to maintain low optical absorption by the p-type layers.

Additional benefits are achieved over pre-existing techniques using the invention. In particular, the invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a non-polar or semipolar gallium nitride material capable of achieving a blue or green laser device, among others. In one or more embodiments, the laser device is capable of emitting long wavelengths such as those ranging from about 480 nm to greater than about 540 nm, but can be others such as 540 nm to 660 nm and 420 nm to 480 nm. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

DETAILED DESCRIPTION OF THE INVENTION

Figure 1:
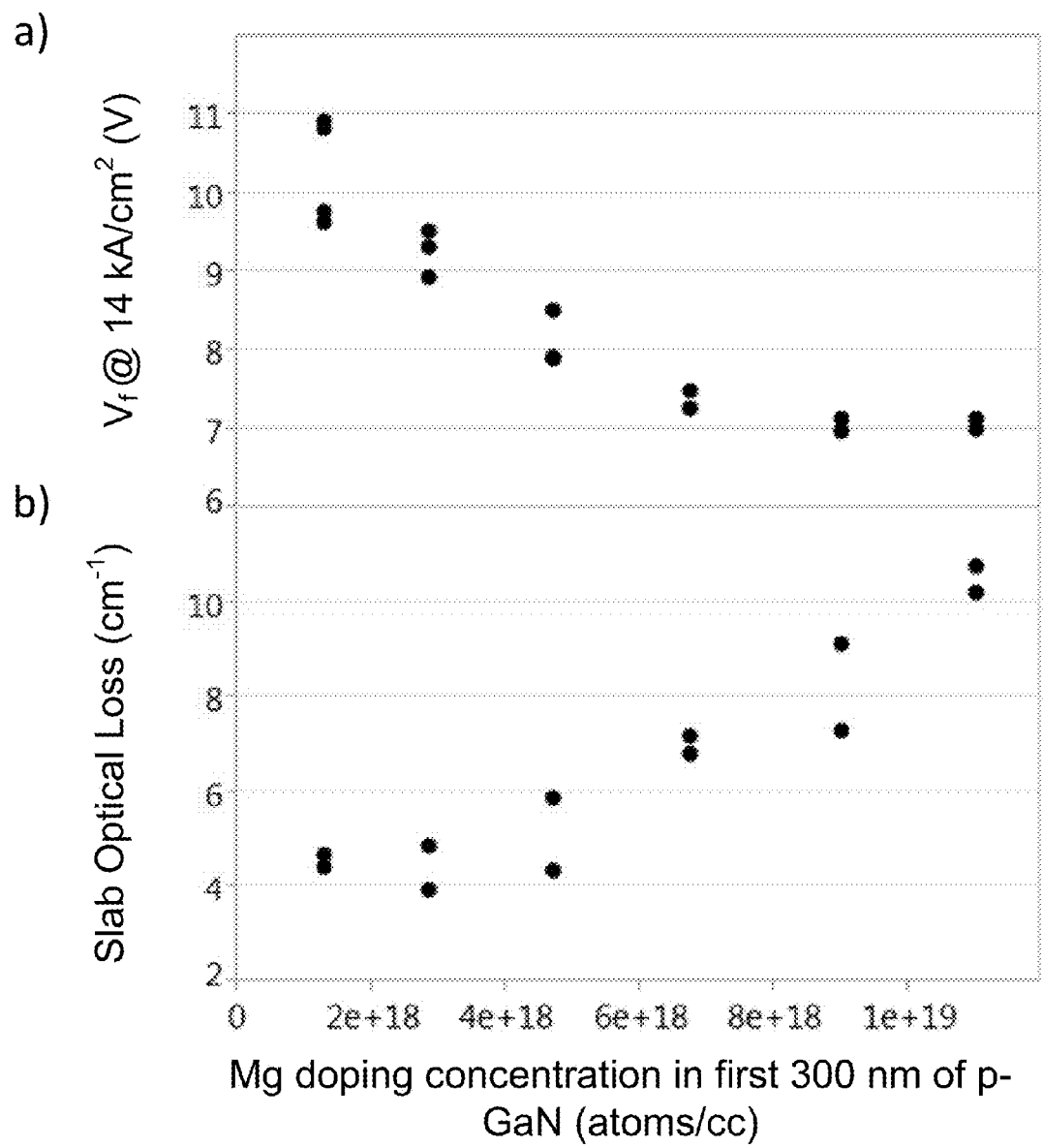
FIG. 1 is a simplified diagram illustrating (a) $V_f$ measured at 14 kA/cm$^2$ and (b) slab optical loss for laser devices with different Mg-doping concentrations in the first 300 nm of the $H_2$ ambient grown p-type cladding layer in an example.

This invention presents a method fabricating a III-nitride optical P-N junction device e.g., laser, LED. What follows is a general description of the typical configuration and fabrication of these devices.

As we discovered, extending emission wavelength from the violet into the green spectra region often requires increasing InN fraction in the active region. Due to the large lattice mismatch between GaN and InN, high InN fractions in the active region typically results in low chemical stability of the active layers. Thermal degradation via thermal annealing during the subsequent p-type (Al,In,Ga)N layer growth has been reported by various groups. Moreover, this phenomenon has been universally observed regardless of growth orientation. It is therefore desirable to maintain a low post-active region growth thermal budget.

In addition to growth challenges associated with long wavelength laser devices are waveguide design issues. Refractive index dispersion leads to a decrease in refractive index contrast between optical waveguide layers with increasing wavelength. For the same waveguide material, the modal confinement in the active region decreases with increasing emission wavelength. This has a concomitant effect on optical loss, since overlap with passive regions will increase as well. In particular, increased loss from activated Mg acceptors can severely degrade laser diode performance. It is therefore desirable to have p-type cladding layers with low Mg concentrations while maintaining acceptable diode voltages.

Growth of high quality p-type cladding material with low resistance and low optical loss, however, is particularly difficult under the constraints of post-active region thermal budget. Lower temperature and/or high growth rate p-type cladding growth typically results in higher [C] impurity concentrations. Since [C] is often regarded as a deep level trap, Mg-doping in these layers must be kept relatively high in order to achieve acceptable diode resistance. In laser diodes, this comes at the expense of optical loss.

In an example, devices include a gallium and nitrogen containing substrate (e.g., GaN) comprising a surface region oriented in either a semipolar or non-polar configuration, but can be others. The device also has a gallium and nitrogen containing material comprising InGaN overlying the surface region. In a specific embodiment, the present laser device can be employed in either a semipolar or non-polar gallium containing substrate, as described below. As used herein, the term "substrate" can mean the bulk substrate or can include overlying growth structures such as a gallium and nitrogen containing epitaxial region, or functional regions such as n-type GaN, combinations, and the like. We have also explored epitaxial growth and cleave properties on semipolar crystal planes oriented between the nonpolar m-plane and the polar c-plane. In particular, we have grown on the {30-31} and {20-21} families of crystal planes. We have achieved promising epitaxy structures and cleaves that will create a path to efficient laser diodes operating at wavelengths from about 400 nm to green, e.g., 500 nm to 540 nm. These results include bright blue epitaxy in the 450 nm range, bright green epitaxy in the 520 nm range, and smooth cleave planes orthogonal to the projection of the c-direction.

It is desirable to align the laser cavities parallel to the projection of the c-direction for maximum gain on this family of crystal planes.

In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density between about $10E5$ cm$^{-2}$ and about $10E7$ cm$^{-2}$ or below $10E5$ cm$^{-2}$. The nitride crystal or wafer may comprise $Al_xIn_yGa_{1-x-y}N$, where $0 \leq x$, y, $x+y \leq 1$. In one specific embodiment, the nitride crystal comprises GaN. In one or more embodiments, the GaN substrate has threading dislocations, at a concentration between about $10E5$ cm$^{-2}$ and about $10E8$ cm$^{-2}$, in a direction that is substantially orthogonal or oblique with respect to the surface. As a consequence of the orthogonal or oblique orientation of the dislocations, the surface dislocation density is between about $10E5$ cm$^{-2}$ and about $10E7$ cm$^{-2}$ or below about $10E5$ cm$^{-2}$. In a specific embodiment, the device can be fabricated on a slightly off-cut semipolar substrate as described in U.S. Ser. No. 12/749,466 filed Mar. 29, 2010, which claims priority to U.S. Provisional No. 61/164,409 filed Mar. 28, 2009, both of which are commonly assigned and hereby incorporated by reference herein.

The substrate typically is provided with one or more of the following epitaxially grown elements, but is not limiting:
- an n-GaN cladding region with a thickness of 50 nm to about 6000 nm with a Si or oxygen doping level of about $5E16$ cm$^{-3}$ to $1E19$ cm$^{-3}$
- an InGaN region of a high indium content and/or thick InGaN layer(s) or Super SCH region;
- a higher bandgap strain control region overlying the InGaN region;
- optionally, an SCH region overlying the InGaN region;
- multiple quantum well active region layers comprised of three to five or four to six 3.0-5.5.0 nm InGaN quantum wells separated by 1.5-10.0 nm GaN barriers
- optionally, a p-side SCH layer comprised of InGaN with molar a fraction of indium of between 1% and 10% and a thickness from 15 nm to 100 nm
- an electron blocking layer comprised of AlGaN with molar fraction of aluminum of between 5% and 20% and thickness from 10 nm to 15 nm and doped with Mg.
- a p-GaN cladding layer with a thickness from 400 nm to 1000 nm with Mg doping level of $5E17$ cm$^{-3}$ to $1E19$ c m$^{-3}$
- a p++-GaN contact layer with a thickness from 20 nm to 40 nm with Mg doping level of $1E20$ cm$^{-3}$ to $1E21$ cm$^{-3}$ Typically each of these regions is formed using at least an epitaxial deposition technique of metal organic chemical vapor deposition (MOCVD), molecular beam epitaxy (MBE), or other epitaxial growth techniques suitable for GaN growth. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w$, x, y, z, $w+x$, $y+z \leq 1$, where w<u, y and/or x>v, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or $AlwInxGa1-w-xN$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, $s+t \leq 1$, with a higher bandgap than the active layer, and may be doped p-type or the electron blocking layer comprises an AlGaN/GaN superlattice structure, comprising alternating layers of AlGaN and GaN. Alternatively, there may be no electron blocking layer. As noted, the p-type gallium nitride structure, is deposited above the electron blocking layer and active layer(s). The p-type layer may be doped with Mg, to a level between about $10E16$ cm-3 and $10E22$ cm-3, and may have a thickness between about 5 nm and about 1000 nm. The outermost 1-50 nm of the p-type layer may be doped more heavily than the rest of the layer, so as to enable an improved electrical contact. These and other features of the present invention can be found throughout the present specification and more particularly below.

In an example, the present invention provides a method for fabricating a light emitting device configured as a Group III-nitride based laser device. The method includes providing a substrate member comprising a gallium and nitrogen containing material and a surface region. The method also includes forming a gallium containing epitaxial material overlying the surface region. The method includes forming a p-type (Al,In,Ga)N waveguiding material overlying the gallium containing epitaxial material under a predetermined process condition. The method includes maintaining the predetermined process condition such that an environment surrounding a growth of the p-type (Al,In,Ga)N waveguide material is substantially a molecular $N_2$ rich gas environment. The method includes maintaining a temperature ranging from 725 C to 925 C during the formation of the p-type (Al,In,Ga)N waveguide material, although there may be variations. In an example, the predetermined process condition is substantially free from molecular $H_2$ gas. Of course, there can be other variations, modifications, and alternatives.

In an example, the p-type (Al,In,Ga)N waveguiding material is grown under the predetermined process consisting of the substantially molecular $N_2$ rich gas environment and the molecular $H_2$ to $N_2$ gas flow ratio into the reactor is less than 1 to 10; wherein the p-type (Al,In,Ga)N waveguiding material is grown at the temperature range during the predetermined process; wherein the p-type (Al,In,Ga)N waveguiding material is characterized by a carbon impurity concentration of less than $1E17$ atoms per cubic centimeter when grown at the temperature range. In an example, the p-type (Al,In,Ga)N waveguiding material is formed using a trimethylgallium metallorganic precursor and/or a triethylgallium metallorganic precursor with a growth rate greater than 0.75 angstrom per second and less than 5. angstrom per second; wherein the p-type (Al,In,Ga)N waveguiding material is formed at the predetermined condition including an ammonia containing species, whereupon the ammonia containing species to molecular $N_2$ gas ratio is greater than 1:5 but less than 2:3; and further comprising forming an n-type gallium nitride material below the p-type (Al,In,Ga)N waveguiding material, the p-type (Al,In,Ga)N waveguiding material is configured as a cladding region.

In an example, the method also includes forming an active region overlying the gallium containing epitaxial material, the active region comprising of a plurality of quantum-well regions, each of the quantum-well regions being configured with a barrier material; and further comprising forming an active region overlying the gallium containing epitaxial material, the active region comprising of a plurality of quantum-well regions, each of the quantum-well regions being configured with a barrier material; and further comprising forming a p-type (Al,In,Ga)N p-type electron blocking layer overlying the active region.

The method can also include forming an active region overlying the gallium containing epitaxial material, the active region comprising of a plurality of quantum-well regions, each of the quantum-well regions being configured with a barrier material; and further comprising an n-type waveguiding material underneath the active region in an example.

In an alternative example, the method includes forming an active region overlying the gallium containing epitaxial material, the active region comprising of a plurality of quantum-well regions, each of the quantum-well regions being configured with a barrier material; and wherein the n-type waveguiding material is comprised of a material with an refractive index lower than the average refractive index of the active region but larger than the n-type cladding material such as indium gallium nitride with indium nitride alloy composition greater than 2% but less than 15%.

In an example, the method includes forming an active region overlying the gallium containing epitaxial material, the active region comprising of a plurality of quantum-well regions, each of the quantum-well regions being configured with a barrier material; and wherein the n-type cladding material is comprised of a material with an refractive index lower than that of the n-type waveguiding material, the material being at least one of an aluminum gallium nitride with aluminum nitride alloy compositions greater than 0% but less than 20%.

In an example, the method includes forming an active region overlying the gallium containing epitaxial material, the active region comprising of a plurality of quantum-well regions, each of the quantum-well regions being configured with a barrier material; and further comprising a p-type waveguiding material overlying the active region; and wherein the p-type waveguiding material is comprised of a material with an refractive index lower than the average refractive index of the active region but larger than the p-type cladding material such as indium gallium nitride with indium nitride alloy composition greater than 2% but less than 15%.

In an example, the method includes forming an active region overlying the gallium containing epitaxial material, the active region comprising of a plurality of quantum-well regions, each of the quantum-well regions being configured with a barrier material; and wherein the p-type cladding material is comprised of a material with an refractive index lower than that of the p-type waveguiding material such as aluminum gallium nitride with aluminum nitride alloy compositions greater than 0% but less than 20%.

In an example, the method includes forming an active region overlying the gallium containing epitaxial material, the active region comprising of a plurality of quantum-well regions, each of the quantum-well regions being configured with a barrier material; and further comprising an active region with defect suppression regions.

In an example, the p-type (Al,In,Ga)N waveguiding material has a thickness from 400 to 1000 nanometer with Mg doping level of 5E17 to 2E19 atoms per cubic centimeter, the waveguiding material being configured as a waveguiding material and a cladding region.

In an example, the method includes forming a highly Mg doped p++ contact layer with a thickness greater than 5 nanometer but lower than 50 nanometer overlying the p-type (Al,In,Ga)N waveguiding material.

In an example, the method further includes introducing a metallorganic or a combination of metallogranic precursors consisting of a group including trimethylgallium, triethylgallium, trimethylaluminum, trimethylindium, or Bis(cyclopentadienyl)magnesium in forming the p-type (Al,In,Ga)N waveguiding material; and wherein the p-type (Al,In,Ga)N waveguiding material is grown using MOCVD or MBE.

In an example, the substrate is configured on a nonpolar (10-10), (11-20), or a related miscut orientation. In an example, the substrate is configured on polar (0001) or (000-1), or a related miscut orientation. In an example, the substrate is configured on a semipolar (20-21), (20-2-1), (30-31), (30-3-1), (11-22), or a related miscut orientation.

In an example, the method can include a misfit dislocation blocking feature configured to the substrate. In an example, the method includes forming a conductive oxide material comprising either an indium tin oxide material or a zinc oxide material overlying the p-type (Al,In,Ga)N material waveguiding material; and forming a metallization layer selected from at least one of Au, Ni, Pd, Al, Pt, or Ti overlying the conductive oxide layer. In an example, the diode voltage of the device is less than 6.75 V at a current density of 14 kA/cm2. In an example, the area on wafer affected by dark spot defects is less than 10%. In an example, the slab optical loss of the device is less than 10 cm-1.

In an example, the invention provides a method for fabricating a light emitting device configured as a Group III-nitride based laser device. In an example, the method includes providing a substrate member comprising a gallium and nitrogen containing material and a surface region and forming a gallium containing epitaxial material overlying the surface region. In an example, the method includes forming a p-type (Al,In,Ga)N waveguiding material overlying the gallium containing epitaxial material under a predetermined process condition. The method includes maintaining the predetermined process condition such that an environment surrounding a growth of the p-type (Al,In,Ga)N waveguide material is substantially a molecular $N_2$ rich gas environment. In an example, the method includes maintaining a temperature ranging from 725 C to 925 C during the formation of the p-type (Al,In,Ga)N waveguide material. In an example, the predetermined process condition is substantially free from molecular $H_2$ gas. In an example, the predetermined process condition comprising initiating formation under the substantially molecular $N_2$ rich gas ambient condition for a first thickness of material and forming a second thickness of material under a non-substantially molecular $N_2$ rich gas environment.

In an alternative example, the invention provides a method for fabricating a light emitting device configured as a Group III-nitride based laser device. In an example, the method includes providing a substrate member comprising a gallium and nitrogen containing material and a surface region. In an example, the method includes forming a gallium containing epitaxial material overlying the surface region and forming a p-type (Al,In,Ga)N waveguiding material overlying the gallium containing epitaxial material under a predetermined process condition, the predetermined process condition being substantially free from molecular $H_2$ gas. In an example, the method includes maintaining the predetermined process condition such that an environment surrounding a growth of the p-type (Al,In,Ga)N waveguide material is substantially a molecular $N_2$ rich gas environment, while maintaining a temperature ranging from 725 C to 925 C during the formation of the p-type (Al,In,Ga)N waveguide material; and further comprising forming an n-type gallium nitride material below the p-type (Al,In,Ga)N waveguiding material, the p-type (Al,In,Ga)N waveguiding material is configured as a cladding region. In an example, the method includes forming an active region overlying the gallium containing epitaxial material, the active region comprising of a plurality of quantum-well regions, each of the quantum-well regions being configured with a barrier material and forming an active region overlying the gallium containing epitaxial material, the active region comprising of a plurality of quantum-well regions, each of the quantum-well regions being configured with a barrier material; and further comprising forming a p-type (Al,In,Ga)N p-type electron blocking layer overlying the active region. In an example, the p-type (Al,In,Ga)N waveguiding material is grown under the predetermined process consisting of the substantially molecular $N_2$ rich gas environment and the molecular $H_2$ to $N_2$ gas flow ratio into the reactor is less than 1 to 10; wherein the p-type (Al,In,Ga)N waveguiding material is grown at the temperature range during the predetermined process; wherein the p-type (Al,In,Ga)N waveguiding material is characterized by a carbon impurity concentration of less than 1E17 atoms per cubic centimeter when grown at the temperature range. In an example, the p-type (Al,In,Ga)N waveguiding material is formed using a trimethylgallium metallorganic precursor and/or a triethylgallium metallorganic precursor with a growth rate greater than 0.75 angstrom per second and less than 5.0 angstrom per second. In an example, the p-type (Al,In,Ga)N waveguiding material is formed at the predetermined condition including an ammonia containing species, whereupon the ammonia containing species to molecular $N_2$ gas ratio is greater than 1:5 but less than 2:3. In an example, the substrate is configured on a nonpolar (10-10), (11-20), or a related miscut orientation or wherein the substrate is configured on polar (0001) or (000-1), or a related miscut orientation or wherein the substrate is configured on a semipolar (20-21), (20-2-1), (30-31), (30-3-1), (11-22), or a related miscut orientation. Further details of the present techniques can be found throughout the present specification and more particularly below.

FIG. 1 shows (a) $V_f$ measured at 14 kA/cm$^2$ and (b) slab optical loss for laser devices with different Mg-doping concentrations in the first 300 nm of the $H_2$ ambient grown p-type cladding layer. Slab optical loss increases as device voltage is reduced via increased Mg-doping.

This inventions provides a method for fabricating high quality p-type (Al,In,Ga)N at low temperatures. By growing p-type (Al,In,Ga)N layers under $N_2$ ambient conditions, lower sheet resistance and higher carrier concentrations can be achieved.

Figure 2:
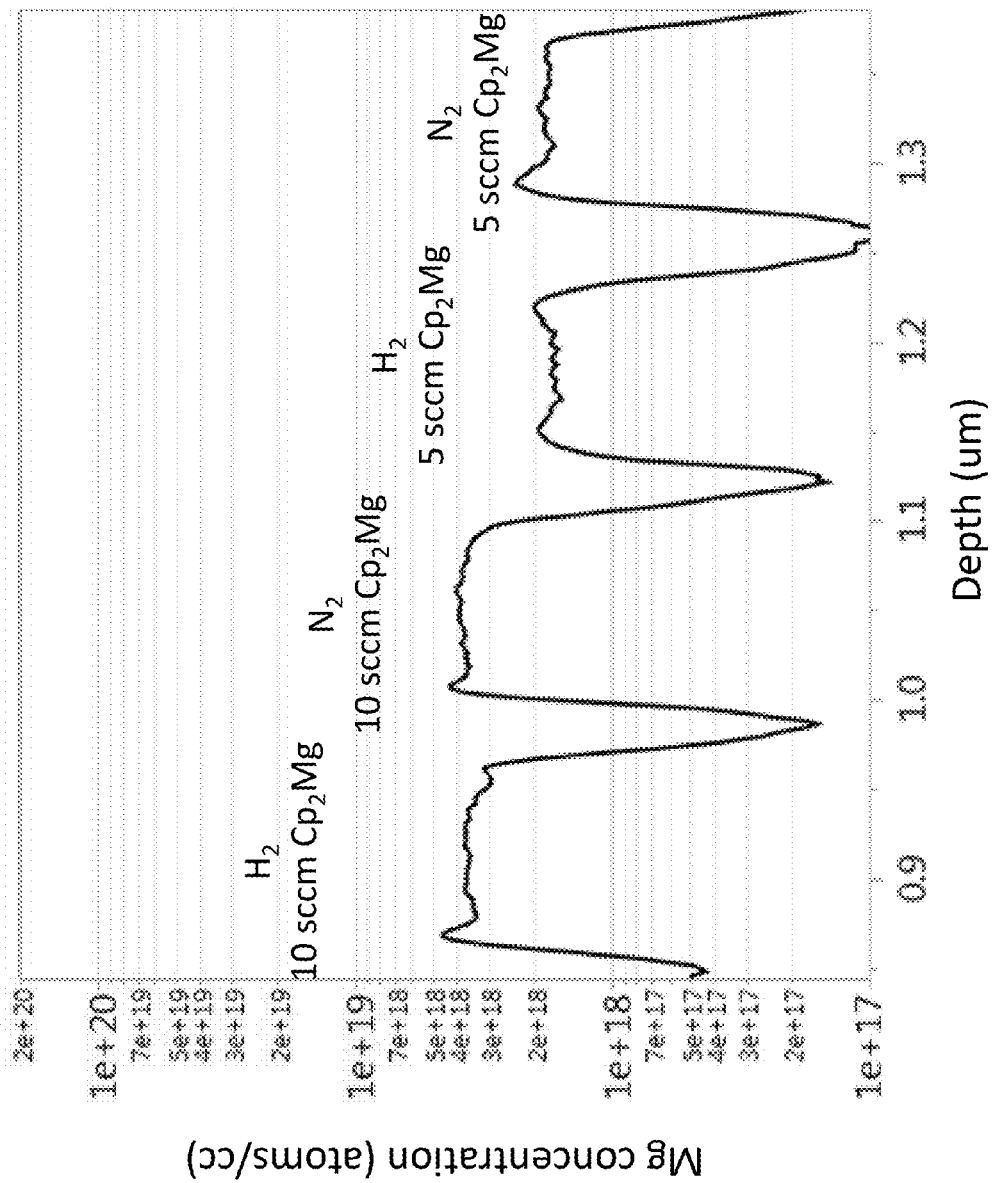
FIG. 2 is a simplified diagram illustrating Mg SIMS stack showing Mg concentrations for two different Cp$_2$Mg flow rates (5 and 10 sccm) in an example (under nominally identical rates, the Mg incorporation rate between $N_2$ ambient and $H_2$ ambient growth p-type GaN is comparable).

FIG. 2 is a simplified diagram illustrating Mg SIMS stack showing Mg concentrations for two different $Cp_2Mg$ flow rates (5 and 10 sccm) in an example. As shown, under nominally identical rates, the Mg incorporation rate between $N_2$ ambient and $H_2$ ambient growth p-type GaN is comparable.

Figure 3:
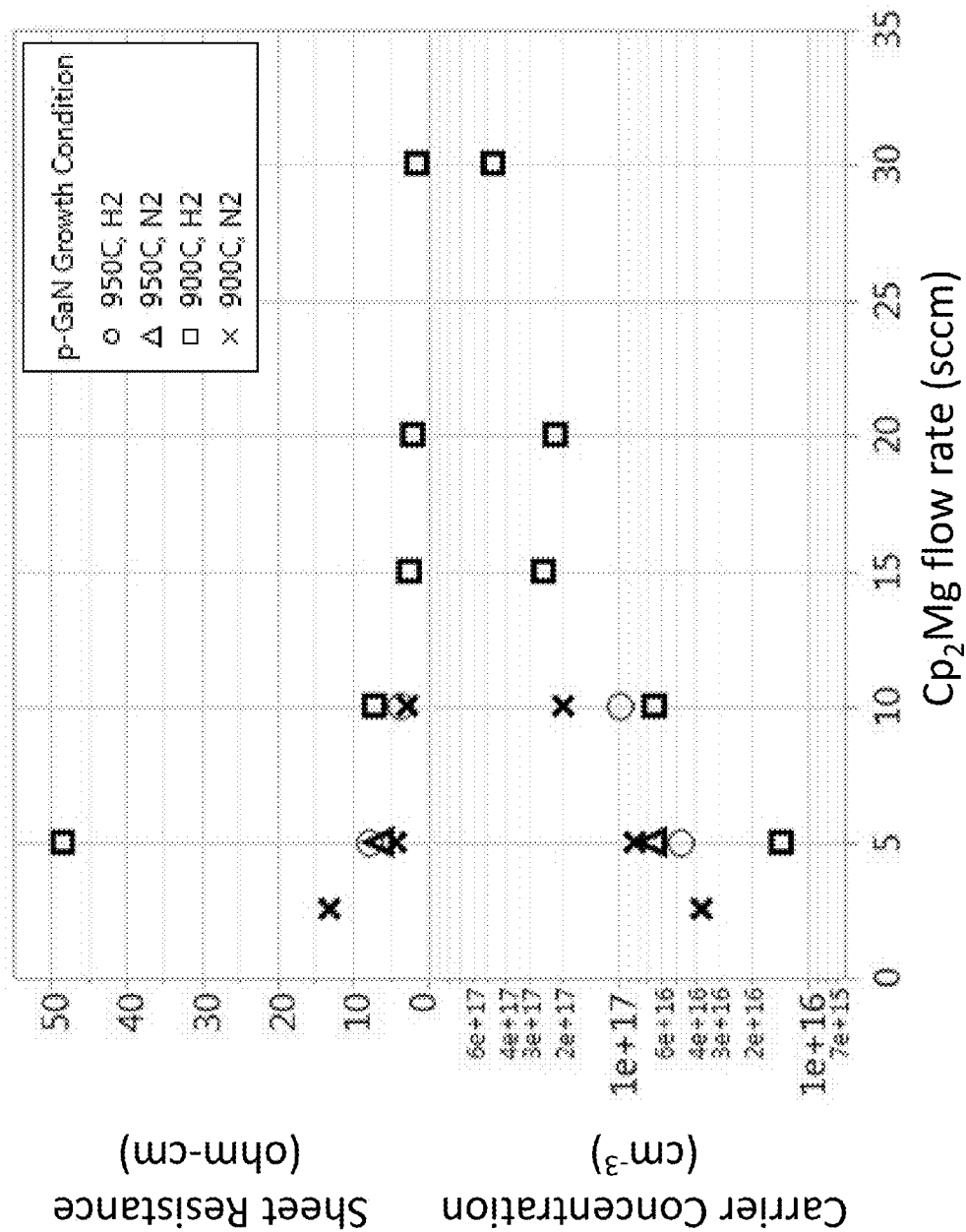
FIG. 3 is a simplified diagram illustrating sheet resistance and carrier concentration measured for p-type GaN grown under $H_2$ ambient 950 C temperature, $H_2$ ambient 900 C temperature, $N_2$ ambient 950 C temperature, and $N_2$ ambient 900 C temperature conditions in an example.

FIG. 3 shows Sheet resistance and carrier concentration measured for p-type GaN grown under $H_2$ ambient 950 C temperature, $H_2$ ambient 900 C temperature, $N_2$ ambient 950 C temperature, and $N_2$ ambient 900 C temperature conditions. 900 C temperature $H_2$ ambient grown p-type (Al,In,Ga)N is characterized by high sheet resistance and low carrier concentrations. By increasing the growth temperature, higher quality p-type (Al,In,Ga)N can be achieved. However, comparable performance p-type (Al,In,Ga)N material can also be achieved by growing under low temperature $N_2$ ambient conditions. Increasing growth temperature under $N_2$ ambient conditions does not further improve p-type (Al,In,Ga)N quality.

Figure 4:
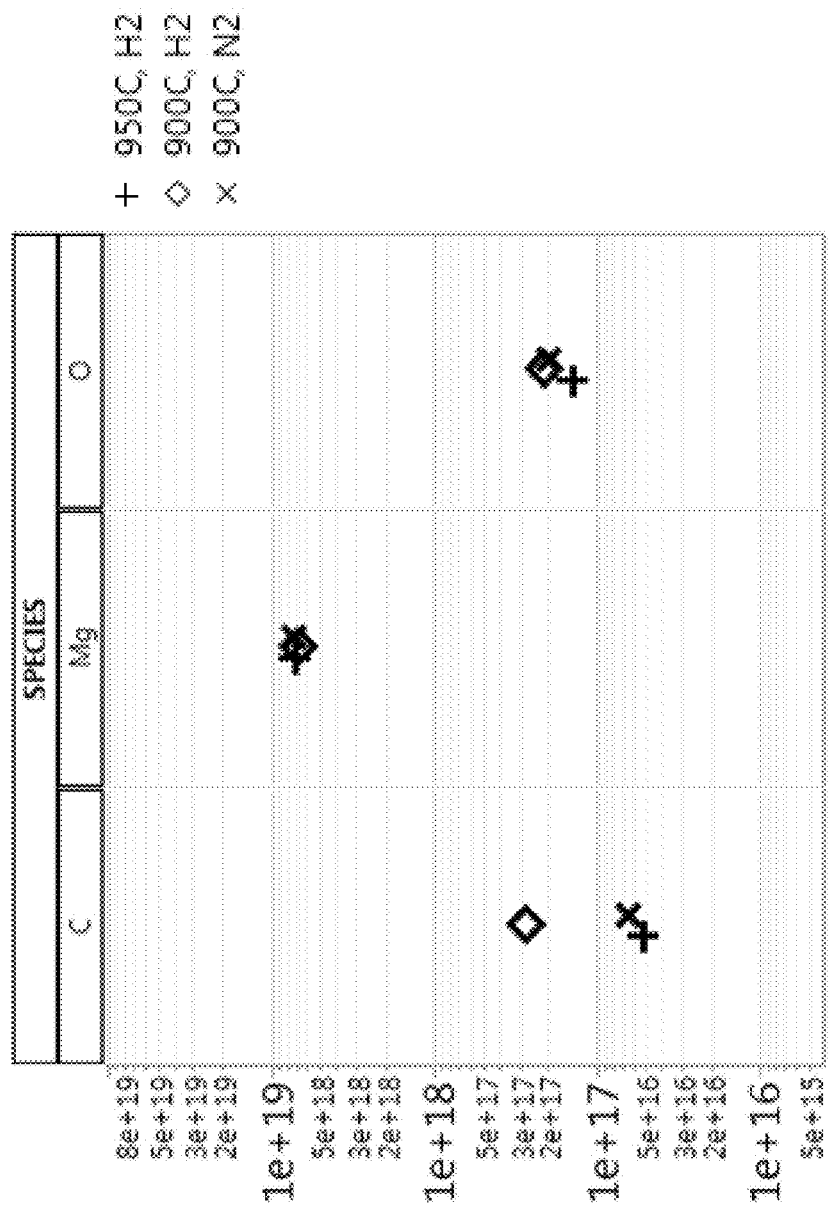
FIG. 4 is a simplified diagram illustrating [C], [Mg], and [O] levels measured from p-type GaN grown under 900 C temperature $H_2$ ambient, 950 C temperature $H_2$ ambient, and 900 C temperature $N_2$ ambient conditions in an example.

FIG. 4 compares carbon, magnesium, and oxygen levels measured from p-type GaN grown under 900 C temperature $H_2$ ambient, 950 C temperature $H_2$ ambient, and 900 C temperature $N_2$ ambient conditions. All three conditions exhibit comparable Mg and O levels when grown under nominally identical growth rates. Carbon levels, however, are significantly higher for low temperature $H_2$ ambient p-type GaN, while low temperature $N_2$ ambient p-type GaN and high temperature $H_2$ ambient p-type GaN exhibit comparable carbon levels.

Figure 5:
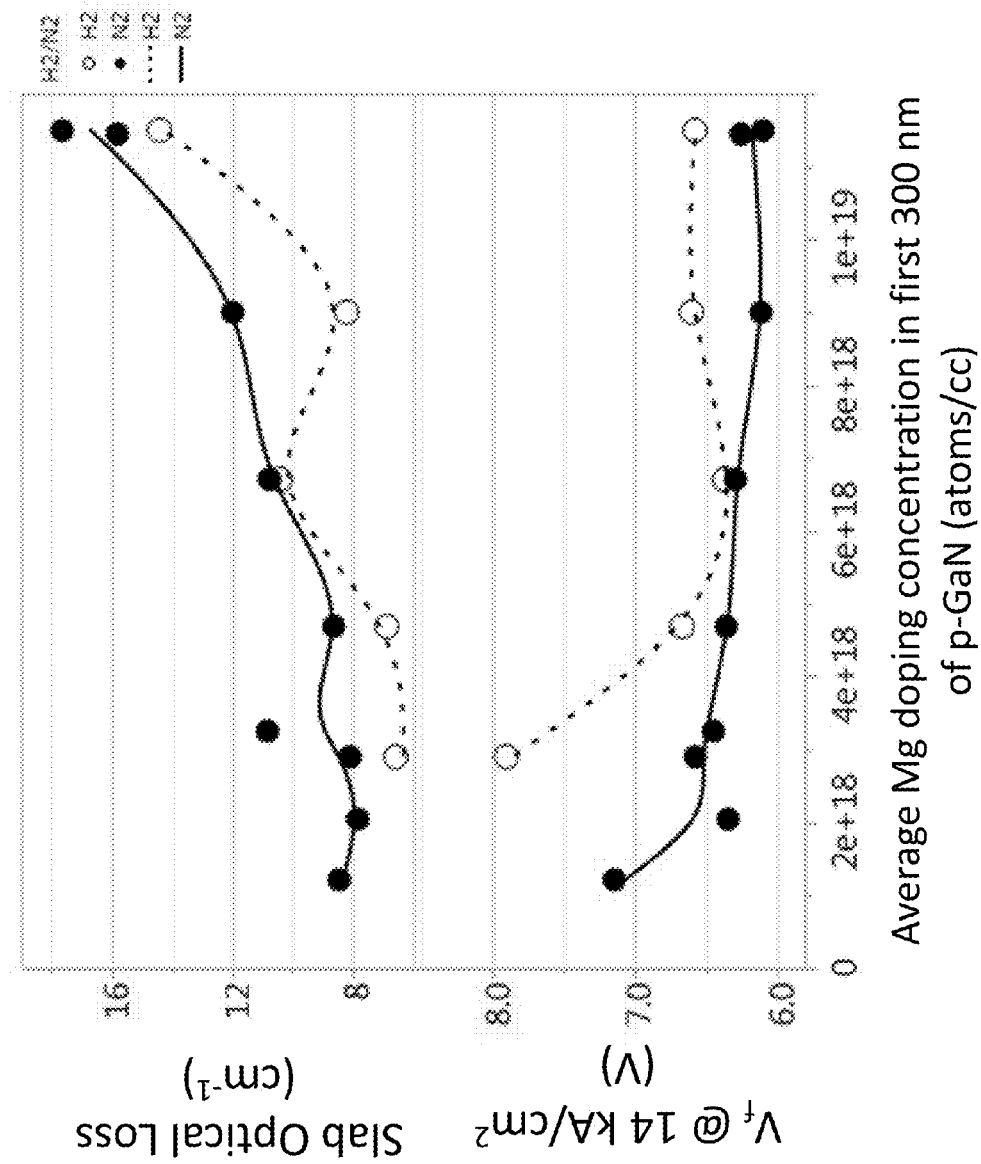
FIG. 5 is a simplified diagram illustrating $V_f$ measured at 14 kA/cm$^2$ and slab optical loss values for laser devices with different Mg-doping profiles in the p-type cladding layers grown under $H_2$ and $N_2$ ambient conditions in an example (the relative Mg concentration increases from left to right).

Lower carbon levels for low temperature $N_2$ ambient p-type layers enables growth of high quality p-type (Al,In,Ga)N cladding layers with lower Mg doping concentrations. FIG. 5 shows $V_f$ measured at 14 kA/cm2 and slab optical loss values for laser devices with different Mg-doping profiles in the p-type cladding layers grown under $H_2$ and $N_2$ ambient conditions. The relative Mg concentration increases from left to right. Optical loss decreases with decreasing Mg concentrations. Mg concentrations in p-type cladding layers grown under $H_2$ ambient conditions can only be lowered to intermediate Mg concentrations before Vf becomes unacceptably high. Mg concentrations in p-type cladding layers grown under $N_2$ ambient conditions, however, can be lowered much further before Vf increase is observed.

This invention resolves two main epitaxial growth issues regarding long wavelength laser devices:
1. Degradation of high InN content active regions due to thermal annealing during growth of post-active region p-type (Al,In,Ga)N waveguiding and cladding layers.
2. High optical loss due to modal overlap with passive p-type (Al,In,Ga)N waveguiding and cladding layers.

Figure 6:
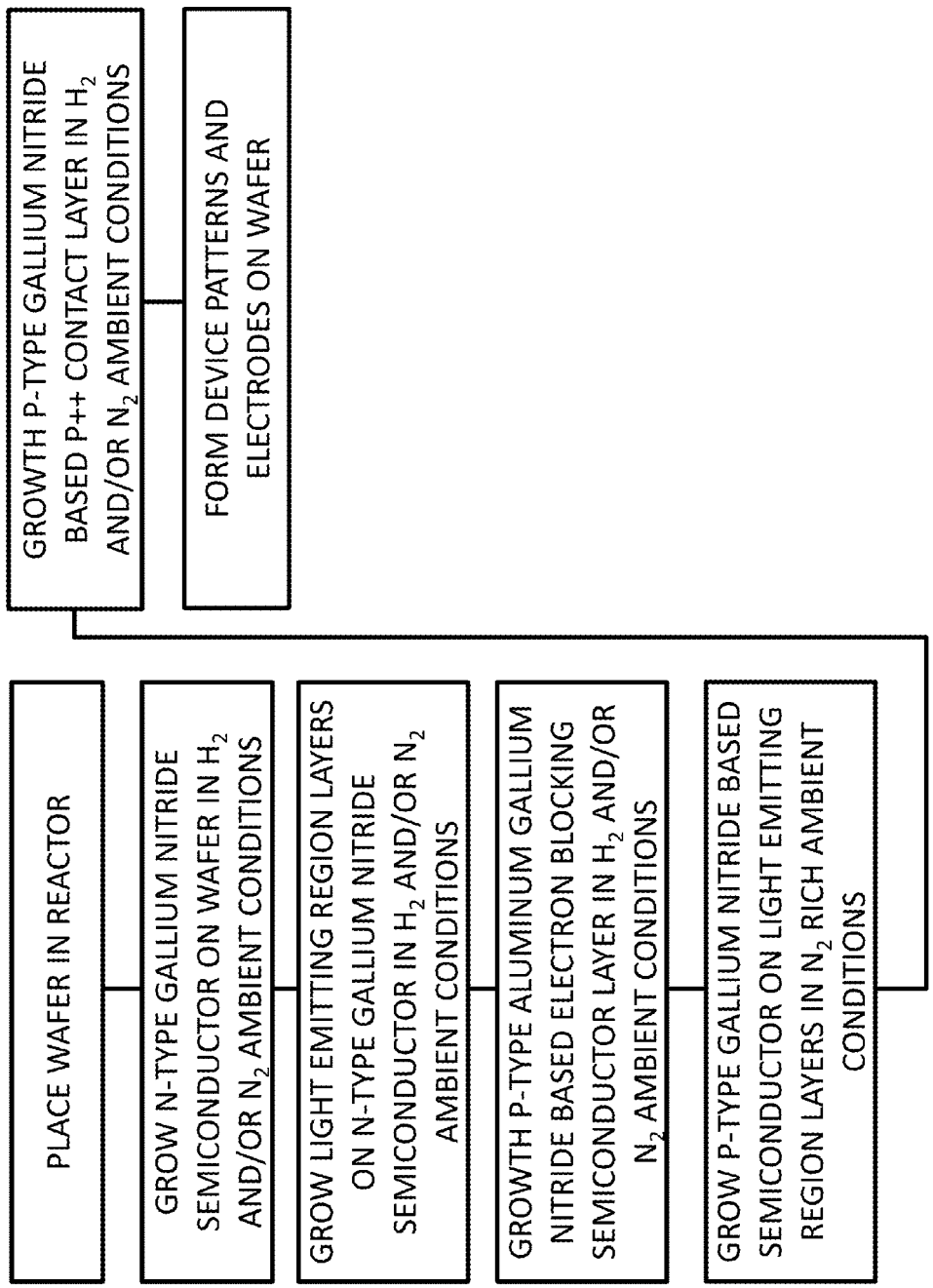
FIG. 6 is a simplified diagram of a flow chart illustrating primary steps in fabricating a nitride semiconductor device and the method of forming an epitaxial wafer according to an example.

FIG. 6 is a simplified diagram of a flow chart illustrating primary steps in fabricating a nitride semiconductor device and the method of forming an epitaxial wafer according to an example. This diagram is merely an example, which should not unduly limit the scope of the claims herein. One of ordinary skill in the art would recognize many alternatives, variations, and modifications in light of the present disclosure. In this example, the substrate wafer is placed into the reactor and brought up to temperatures 1175 C>T>700 C under either $H_2$ or $N_2$ rich ambient conditions. N-type cladding and/or waveguiding (Al,In,Ga)N material is grown under $H_2$ or $N_2$ rich ambient conditions. Light emitting active material, typically consisting a plurality of InGaN quantum-wells and (Al,In,Ga)N quantum-barriers, is grown on top of the n-type cladding/waveguiding material. In some practices, an p-type (Al,In,Ga)N material (electron blocking layer) with bandgap larger than that of the quantum-well and quantum-barrier is grown on top of the light emitting active material. P-type cladding and/or waveguiding (Al,In,Ga)N material is then subsequently grown. In this specific example, the p-type cladding and/or waveguiding (Al,In,Ga)N material is grown under $N_2$ rich conditions with growth temperatures in the ranges of 700 C>T>950 C. The method of our invention is most useful within this temperature range. After the p-type cladding/waveguiding (Al,In,Ga)N material growth, the epitaxial structure is capped with a Mg doped (Al,In,Ga)N p-contact layer with thickness in the range of 5 to 45 nm. After the p-contact layer is grown, the temperature in the reactor is ramped down to room temperature and the substrate is unloaded from the reactor. Laser device patterns, including electrode metallization, are then made on the wafers using standard microelectronic fabrication processes.

In a preferred embodiment, the p-type (Al,In,Ga)N cladding material of an optoelectronic device is epitaxially grown under pure $N_2$ ambient conditions at sufficiently low temperatures as not to cause thermal degradation in the high InN fraction active region. In a second embodiment, the p-type (Al,In,Ga)N cladding material of an optoelectronic device is epitaxially grown under a mixture of $N_2/H_2$ ambient conditions at sufficiently low temperatures as not to cause thermal degradation in the high InN fraction active region. In a third embodiment, portions of the p-type (Al,In,Ga)N cladding material can be grown under a mixture of $N_2/H_2$ ambient conditions or full $N_2$ ambient conditions. For example, part of the p-type (Al,In,Ga)N cladding material can be grown under low temperature conditions under $N_2$ ambient conditions to keep [C] impurity levels low, while other portions of the p-type (Al,In,Ga)N cladding material are grown under high temperature conditions where [C] impurity levels are not an issue. In this embodiment, the overall thermal budget is kept low so as not to induce defect formation in the quantum-well active region. In all embodiments, the Mg-doping in p-type (Al,In,Ga)N cladding material is kept sufficiently low to maintain low optical absorption by the p-type layers.

Low temperature p-type (Al,In,Ga)N cladding layers grown under $N_2$ ambient conditions can be combined with other technologies to produce high performance lasers. In an embodiment, a laser device with $N_2$ ambient grown p-type (Al,In,Ga)N cladding material can be grown on semipolar orientation substrates that have been patterned with dislocation blocking features. These features can be patterned lithographically and then dry etched, or can be laser scribed into the wafers. In another embodiment, laser device with defect suppression layers in the active region can be combined with p-type (Al,In,Ga)N cladding material grown under $N_2$ ambient conditions to produce high quality, low defect epi-structures.

Figure 7:
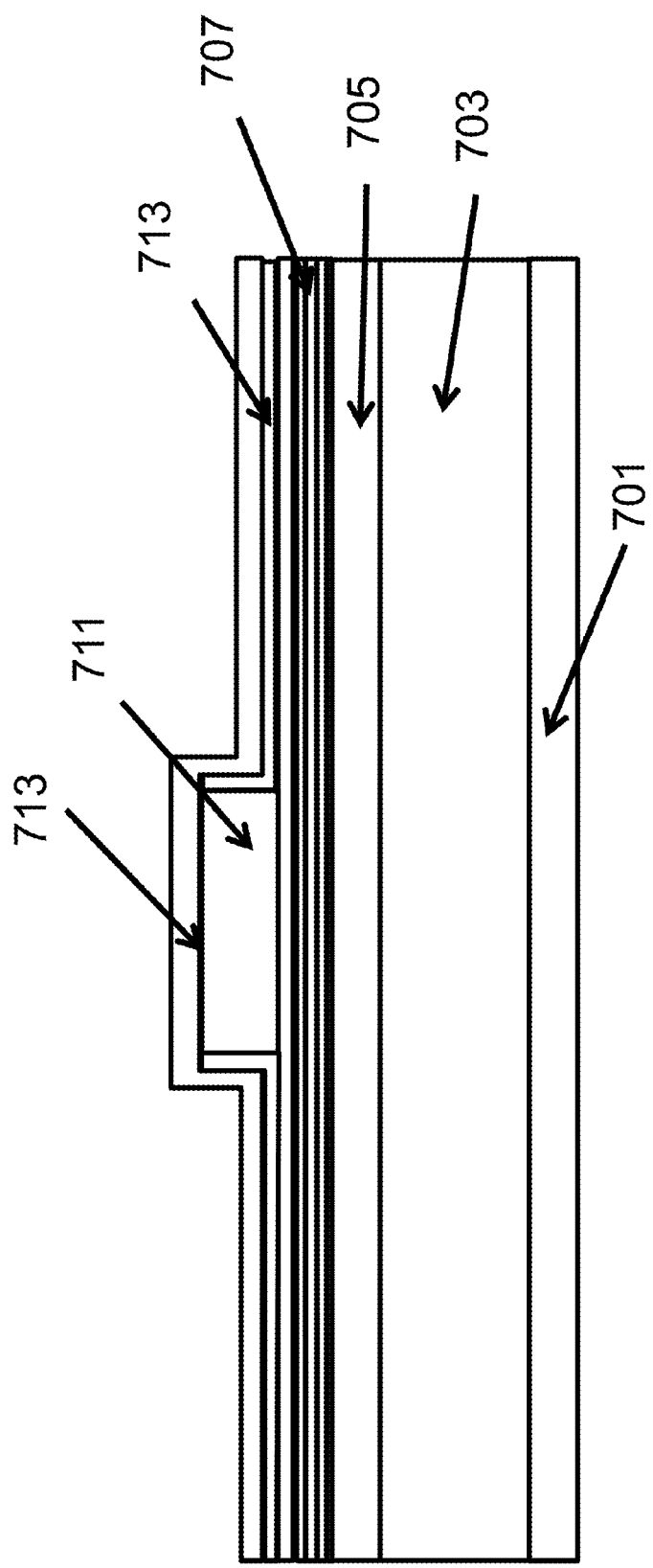
FIG. 7 is an illustration of a simplified schematic cross-sectional diagram illustrating a state of the art laser diode structure in an example.

FIG. 7 is a simplified schematic cross-sectional diagram illustrating a laser diode structure according to embodiments of the present disclosure. This diagram is merely an example, which should not unduly limit the scope of the claims herein. One of ordinary skill in the art would recognize other variations, modifications, and alternatives in light of the present disclosure. As shown, the laser device includes gallium nitride substrate 703, which has an underlying n-type metal back contact region 701. In an embodiment, the metal back contact region is made of a suitable material such as those noted below and others. In an embodiment, the device also has an overlying n-type gallium nitride layer 705, an active region 707, and an overlying p-type gallium nitride layer structured as a laser stripe region 711 (or p-type waveguiding material). Herein the p-type gallium nitride 711 is grown under $N_2$ rich ambient conditions and at sufficiently low temperature as not to thermally degrade the high indium composition active region. Additionally, the device also includes an n-side separate confinement heterostructure (SCH) 706, p-side guiding layer or SCH 708, p-AlGaN EBL 709, among other features. In an embodiment, the device also has a p++ type gallium nitride material 713 to form a contact region. Further details of the contact region can be found throughout the present specification and more particularly below.

In an embodiment, the device also has an overlying n-type gallium nitride layer 705, an active region 707, and an overlying p-type gallium nitride layer structured as a laser stripe region 711. Additionally, the device also includes an n-side separate confinement heterostructure (SCH) 706, p-side guiding layer or SCH 708, p-AlGaN EBL 709, among other features. In an embodiment, the device also has a p++ type gallium nitride material 713 to form a contact region. In an embodiment, the p++ type contact region has a suitable thickness and may range from about 10 nm to 50 nm, or other thicknesses. In an embodiment, the doping level can be higher than the p-type cladding region and/or bulk region. In an embodiment, the p++ type region has doping concentration ranging from about $10^{19}$ to $10^{21}$ Mg/cm$^3$, and others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

Figure 8:
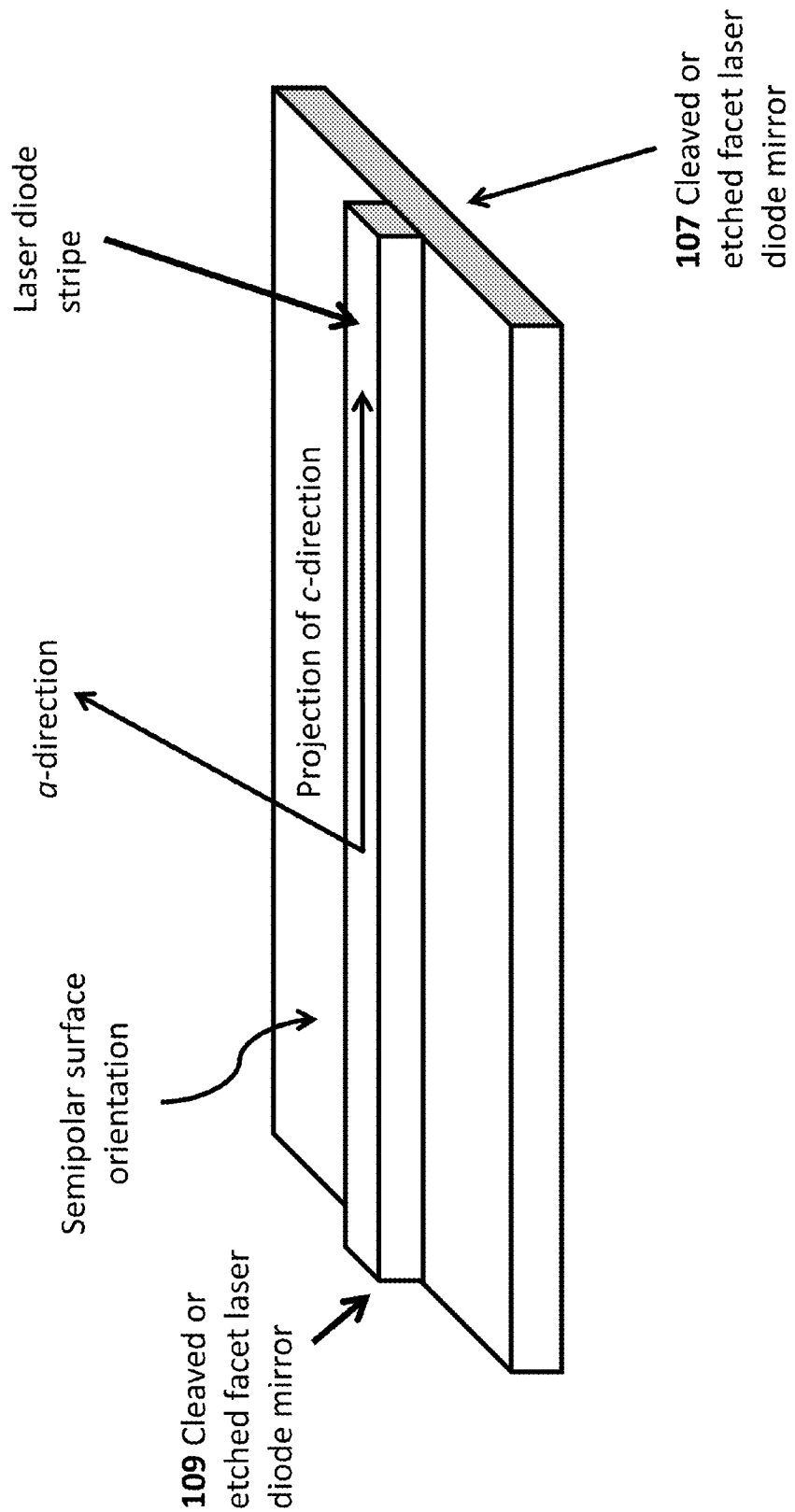
FIG. 8 is an illustration of a perspective view diagram of a laser diode according to an example.

The device has a laser stripe region formed overlying a portion of the off-cut crystalline orientation surface region. As example, FIG. 8 is a simplified schematic diagram of semipolar laser diode with the cavity aligned in the projection of c-direction with cleaved or etched mirrors. The laser stripe region is characterized by a cavity orientation substantially in a projection of a c-direction, which is substantially normal to an a-direction. The laser strip region has a first end 107 and a second end 109 and is formed on a projection of a c-direction on a {20-21} gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

Laser scribe Pattern: The pitch of the laser mask is about 200 um, but can be others. The method uses a 170 um scribe with a 30 um dash for the 200 um pitch. In a preferred embodiment, the scribe length is maximized or increased while maintaining the heat affected zone of the laser away from the laser ridge, which is sensitive to heat.

Laser scribe Profile: A saw tooth profile generally produces minimal facet roughness. It is believed that the saw tooth profile shape creates a very high stress concentration in the material, which causes the cleave to propagate much easier and/or more efficiently.

In a specific embodiment, the method of facet formation includes subjecting the substrates to mechanical scribing for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a diamond tipped scribe to physically scribe the laser bars, though as would be obvious to anyone learned in the art a scribe tipped with any material harder than GaN would be adequate. In a specific embodiment, the laser is configured on a system, which allows for accurate scribe lines configured in one or more different patterns and profiles. In one or more embodiments, the mechanical scribing can be performed on the back-side, front-side, or both depending upon the application. Of course, there can be other variations, modifications, and alternatives.

In a specific embodiment, the method uses backside scribing or the like. With backside mechanical scribing, the method preferably forms a continuous line scribe that is perpendicular to the laser bars on the backside of the GaN substrate. In a specific embodiment, the laser scribe is generally 15-20 um deep or other suitable depth. Preferably, backside scribing can be advantageous. That is, the mechanical scribe process does not depend on the pitch of the laser bars or other like pattern. Accordingly, backside scribing can lead to a higher density of laser bars on each substrate according to a preferred embodiment. In a specific embodiment, backside mechanical scribing, however, may lead to residue from the tape on one or more of the facets. In a specific embodiment, backside mechanical scribe often requires that the substrates face down on the tape. With front-side mechanical scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($SixNy$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and 93 degrees or between about 89 and 91 degrees from the surface plane of the wafer. The etched facet surface region must be very smooth with root mean square roughness values of less than 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between 10 microns and 400 microns, between about 400 microns and 800 microns, or about 800 microns and 1600 microns, but could be others. The stripe also has a width ranging from about 0.5 microns to about 50 microns, but is preferably between 0.8 microns and 2.5 microns for single lateral mode operation or between 2.5 um and 50 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from 3.0 microns to about 50 microns, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact.

The n-type electrical contact may be deposited by thermal evaporation, electron beam evaporation, electroplating, sputtering, or another suitable technique.

P-type (Al,In,Ga)N layers grown epitaxially by MOCVD typically require a $H_2$ ambient condition. It is universally believed that $H_2$ ambient growth conditions are necessary to achieve low resistance p-type (Al,In,Ga)N. Our invention shows that at low temperatures, p-type (Al,In,Ga)N grown under $N_2$ ambient conditions has lower resistance and higher carrier concentration than p-type (Al,In,Ga)N grown under $H_2$ ambient conditions.

Low temperature p-type (Al,In,Ga)N is typically desired in long wavelength emission devices since high InN content active regions are prone to thermal degradation during growth of post-active region layers. High temperature p-type (Al,In,Ga)N growth is problematic for laser diode devices in particular due to the necessity of a sufficiently thick p-type optical waveguiding material. Long growth times at elevated temperature required for thick p-type (Al,In,Ga)N deposition of the cladding leads to degradation of the light emitting layers. The p-type (Al,In,Ga)N cladding material can be grown at low temperatures, but this usually results in lower quality p-type cladding material due to higher impurity concentrations that can compensate acceptors. In order to keep diode voltage low, Mg-doping concentrations must be increased. In laser diodes, this comes at the expense of optical loss.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semipolar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

In an example, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Publication No. 2010/0302464, which is incorporated by reference herein.

In other embodiments, the present laser device can be configured in a variety of applications. Such applications include laser displays, metrology, communications, health care and surgery, information technology, and others. As an example, the present laser device can be provided in a laser display such as those described in U.S. application Ser. No. 12/789,303 filed on May 27, 2010, which is incorporated by reference herein.

As used herein, the term "substrate" can mean the bulk substrate or can include overlying growth structures such as a gallium and nitrogen containing epitaxial region, or functional regions such as n-type GaN, combinations, and the like. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Although the embodiments above have been described in terms of a laser diode, the methods and device structures can also be applied to any light emitting diode device. Therefore, the above description and illustrations should not be taken as limiting the scope of the present invention which is defined by the appended claims.

In an example, the present method and system can also include use of one or more of a variety of wavelength conversion species.

Wavelength conversion materials can be ceramic or semiconductor particle phosphors, ceramic or semiconductor plate phosphors, organic or inorganic downconverters, upconverters (anti-stokes), nano-particles and other materials which provide wavelength conversion. Some examples are listed below:

$(Sr_n,Ca_{1-n})10(PO4)6*B2O3:Eu2+$ (wherein $0 \leq n \leq 1$)
$(Ba,Sr,Ca)5(PO4)3(Cl,F,Br,OH):Eu2+,Mn2+$
$(Ba,Sr,Ca)BPO5:Eu2+,Mn2+$
$Sr2Si3O8*2SrCl2:Eu2+$
$(Ca,Sr,Ba)3MgSi2O8:Eu2+, Mn2+$
$BaAl8O13:Eu2+$
$2SrO*0.84P2O5*0.16B2O3:Eu2+$
$(Ba,Sr,Ca)MgAl10O17:Eu2+,Mn2+$
$K2SiF6:Mn4+$
$(Ba,Sr,Ca)Al2O4:Eu2+$
$(Y,Gd,Lu,Sc,La)BO3:Ce3+,Tb3+$
$(Ba,Sr,Ca)2(Mg,Zn)Si2O7:Eu2+$
$(Mg,Ca,Sr, Ba,Zn)2Si1-xO4-2x:Eu2+$ (wherein $0 \leq x \leq 0.2$)
$(Ca, Sr, Ba)MgSi2O6: Eu2+$
$(Sr,Ca,Ba)(Al,Ga)2S4:Eu2+$
$(Ca,Sr)8(Mg,Zn)(SiO4)4Cl2:Eu2+,Mn2+$
$Na2Gd2B2O7:Ce3+,Tb3+$
$(Sr,Ca,Ba,Mg,Zn)2P2O7:Eu2+,Mn2+$
$(Gd,Y,Lu,La)2O3:Eu3+,Bi3+$
$(Gd,Y,Lu,La)2O2S:Eu3+,Bi3+$
$(Gd,Y,Lu,La)VO4:Eu3+,Bi3+$
$(Ca,Sr)S:Eu2+,Ce3+$
$(Y,Gd,Tb,La,Sm,Pr,Lu)3(Sc,Al,Ga)5-nO12-3/2n:Ce3+$ (wherein $0 \leq n \leq 0.5$)
$ZnS:Cu+,Cl-$
$(Y,Lu,Th)3Al5O12:Ce3+$
$ZnS:Cu+,Al3+$
$ZnS:Ag+,Al3+$
$ZnS:Ag+,Cl-$ The group:
$Ca1-xAlx-xySi1-x+xyN2-x-xyCxy:A$
$Ca1-x-zNazM(III)x-xy-zSi1-x+xy+zN2-x-xyCxy:A$
$M(II)1-x-zM(I)zM(III)x-xy-zSi1-x+xy+zN2-x-xy-Cxy:A$
$M(II)1-x-zM(I)zM(III)x-xy-zSi1-x+xy+zN2-x-xy-2w/3CxyOw-v/2Hv:A$
$M(II)1-x-zM(I)zM(III)x-xy-zSi1-x+xy+zN2-x-xy-2w/3-v/3CxyOwHv:A$ wherein $0<x<1$, $0<y<1$, $0 \leq z<1$, $0 \leq v<1$, $0<w<1$, $x+z<1$, $x>xy+z$, and $0<x-xy-z<1$, M(II) is at least one divalent cation, M(I) is at least one monovalent cation, M(III) is at least one trivalent cation, H is at least one monovalent anion, and A is a luminescence activator doped in the crystal structure.

$LaAl(Si 6-z Al z)(N 10-z Oz):Ce3+$ (wherein $z=1$)

(Ca, Sr) Ga2S4: Eu2+
AlN:Eu2+
SrY2S4:Eu2+
CaLa2S4:Ce3+
(Ba,Sr,Ca)MgP2O7:Eu2+,Mn2+
(Y,Lu)2WO6:Eu3+,Mo6+
CaWO4
(Y,Gd,La)2O2S:Eu3+
(Y,Gd,La)2O3:Eu3+
(Ba,Sr,Ca)nSinNn:Eu2+(where 2n+4=3n)
Ca3(SiO4)Cl2:Eu2+
(Y,Lu,Gd)2−nCanSi4N6+nC1−n:Ce3+, (wherein 0≤n≤0.5)
(Lu,Ca,Li,Mg,Y) alpha-SiAlON doped with Eu2+ and/or Ce3+
(Ca,Sr,Ba)SiO2N2:Eu2+,Ce3+
Ba3MgSi2O8:Eu2+,Mn2+
(Sr,Ca)AlSiN3:Eu2+
CaAlSi(ON)3:Eu2+
Ba3MgSi2O8:Eu2+
LaSi 3N5:Ce3+
Sr10(PO4)6Cl2:Eu2+
(BaSi)O12N2:Eu2+
M(II)aSibOcNdCe:A wherein (6<a<8, 8<b<14, 13<c<17, 5<d<9, 0<e<2) and M(II) is a divalent cation of (Be, Mg,Ca,Sr,Ba,Cu,Co,Ni,Pd,Tm,Cd) and A of (Ce,Pr,Nd, Sm,Eu,Gd,Tb,Dy,Ho,Er,Tm,Yb,Lu,Mn,Bi,Sb)
SrSi2(O,Cl)2N2:Eu2+
SrSi 9Al19 ON31:Eu2+
(Ba,Sr)Si2(O,Cl)2N2:Eu2+
LiM2O8:Eu3+ where M=(W or Mo)

For purposes of the application, it is understood that when a phosphor has two or more dopant ions (i.e. those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation.

Further, it is to be understood that nanoparticles, quantum dots, semiconductor particles, and other types of materials can be used as wavelength converting materials. The list above is representative and should not be taken to include all the materials that may be utilized within embodiments described herein.

While the above is a full description of the specific embodiments, various modifications, alternative constructions and equivalents may be used. Although the technique has been described in terms of a specific temperature range, there can be variations in some examples. Therefore, the above description and illustrations should not be taken as limiting the scope of the present invention which is defined by the appended claims.

What is claimed is:

1. A method for fabricating a light emitting device configured as a Group III-nitride based laser device, the method comprising:
   providing a substrate member comprising a gallium and nitrogen containing material and a surface region;
   forming a gallium containing epitaxial material overlying the surface region;
   forming a p-type (Al,In,Ga)N waveguiding material overlying the gallium containing epitaxial material under a predetermined process condition;
   maintaining the predetermined process condition such that an environment surrounding a growth of the p-type (Al,In,Ga)N waveguiding material is substantially molecular $N_2$ rich gas environment; and
   maintaining a temperature ranging from 725 C to 925 C during the formation of the p-type (Al,In,Ga)N waveguiding material;
   whereupon the predetermined process condition consists of the substantially molecular $N_2$ rich gas environment and a molecular $H_2$ to $N_2$ gas flow ratio of less than 1 to 10; wherein the p-type (Al,In,Ga)N waveguiding material is grown at the temperature range during the predetermined process condition; wherein the p-type (Al,In,Ga)N waveguiding material is characterized by a carbon impurity concentration of less than 1E17 atoms per cubic centimeter.

2. The method of claim 1 further comprising forming an active region overlying the gallium containing epitaxial material, the active region comprising of a plurality of quantum-well regions, each of the quantum-well regions being configured with a barrier material; and further comprising forming a p-type (Al,In,Ga)N electron blocking layer overlying the active region.

3. The method of claim 1 further comprising forming an active region overlying the gallium containing epitaxial material, the active region comprising of a plurality of quantum-well regions, each of the quantum-well regions being configured with a barrier material; and further comprising forming an n-type waveguiding material underneath the active region.

4. The method of claim 3 wherein the n-type waveguiding material is comprised of a material with a refractive index lower than an average refractive index of the active region but larger than indium gallium nitride with indium nitride alloy composition greater than 2% but less than 15%.

5. The method of claim 4 wherein the n-type waveguiding material comprises an aluminum gallium nitride with aluminum nitride alloy compositions greater than 0% but less than 20%.

6. The method of claim 1 further comprising forming an active region overlying the gallium containing epitaxial material, the active region comprising of a plurality of quantum-well regions, each of the quantum-well regions being configured with a barrier material; wherein the p-type (Al,In,Ga)N waveguiding material overlies the active region; and wherein the p-type (Al,In,Ga)N waveguiding material is comprised of a material with a refractive index lower than an average refractive index of the active region but larger than indium gallium nitride with indium nitride alloy composition greater than 2% but less than 15%.

7. The method of claim 6 wherein the p-type (Al,In,Ga)N waveguiding material comprises aluminum gallium nitride with aluminum nitride alloy compositions greater than 0% but less than 20%.

8. The method of claim 1 further comprising forming an active region overlying the gallium containing epitaxial material, the active region comprising of a plurality of quantum-well regions, each of the quantum-well regions being configured with a barrier material; wherein the active region comprises defect suppression regions.

9. The method of claim 1 further comprising forming a highly Mg doped p++ contact layer with a thickness greater than 5 nanometer but lower than 50 nanometer overlying the p-type (Al,In,Ga)N waveguiding material.

10. The method of claim 1 further comprising introducing a metallorganic or a combination of metallogranic precursors consisting of a group including trimethylgallium, triethylgallium, trimethylaluminum, trimethylindium, or Bis(cyclopentadienyl)magnesium while forming the p-type (Al, In,Ga)N waveguiding material; and wherein the p-type (Al,In,Ga)N waveguiding material is grown using MOCVD or MBE.

11. The method of claim 1 wherein the substrate member is configured on a nonpolar (10-10), (11-20), or a related miscut orientation.

12. The method of claim 1 wherein the substrate member is configured on polar (0001) or (000-1), or a related miscut orientation.

13. The method of claim 1 wherein the substrate member is configured on a semipolar (20-21), (20-2-1), (30-31), (30-3-1), (11-22), or a related miscut orientation.

14. The method of claim 1 wherein the substrate member comprises a misfit dislocation blocking feature.

15. The method of claim 1 further comprising forming a conductive oxide material comprising either an indium tin oxide material or a zinc oxide material overlying the p-type (Al,In,Ga)N waveguiding material; and forming a metallization layer selected from at least one of Au, Ni, Pd, Al, Pt, or Ti overlying the conductive oxide material.

16. The method of claim 1 wherein a diode voltage of the light emitting device is less than 6.75 V at a current density of 14 kA/cm$^2$.

17. The method of claim 1 wherein an area on the substrate member affected by dark spot defects is less than 10%.

18. The method of claim 1 wherein a slab optical loss of the light emitting device is less than 10 cm$^{-1}$.

19. A method for fabricating a light emitting device configured as a Group III-nitride based laser device, the method comprising:
   providing a substrate member comprising a gallium and nitrogen containing material and a surface region;
   forming a gallium containing epitaxial material overlying the surface region;
   forming a p-type (Al,In,Ga)N waveguiding material overlying the gallium containing epitaxial material under a predetermined process condition;
   maintaining the predetermined process condition such that an environment surrounding a growth of the p-type (Al,In,Ga)N waveguiding material is substantially molecular N$_2$ rich gas environment; and
   maintaining a temperature ranging from 725 C to 925 C during the formation of the p-type (Al,In,Ga)N waveguiding material;
   whereupon the predetermined process condition is substantially free from molecular H$_2$ gas, the p-type (Al,In,Ga)N waveguiding material is formed using a trimethylgallium metalorganic precursor and/or a triethylgallium metalorganic precursor with a growth rate greater than 0.75 angstroms per second and less than 5.0 angstroms per second; wherein the p-type (Al,In,Ga)N waveguiding material is formed at the predetermined process condition including an ammonia containing species, whereupon a ratio of the ammonia containing species to the substantially molecular N$_2$ rich gas is greater than 1:5 but less than 2:3; and further comprising forming an n-type gallium nitride material below the p-type (Al,In,Ga)N waveguiding material, the p-type (Al,In,Ga)N waveguiding material configured as a cladding region.

20. A method for fabricating a light emitting device configured as a Group III-nitride based laser device, the method comprising:
   providing a substrate member comprising a gallium and nitrogen containing material and a surface region;
   forming a gallium containing epitaxial material overlying the surface region;
   forming a p-type (Al,In,Ga)N waveguiding material overlying the gallium containing epitaxial material under a predetermined process condition;
   maintaining the predetermined process condition such that an environment surrounding a growth of the p-type (Al,In,Ga)N waveguiding material is substantially molecular N$_2$ rich gas environment; and
   maintaining a temperature ranging from 725 C to 925 C during the formation of the p-type (Al,In,Ga)N waveguiding material;
   whereupon the predetermined process condition is substantially free from molecular H$_2$ gas, the p-type (Al,In,Ga)N waveguiding material has a thickness from 400 to 1000 nanometer with Mg doping level of 5E17 to 2E19 atoms per cubic centimeter, the p-type (Al,In,Ga)N waveguiding material being configured as a waveguiding material and a cladding region.

21. A method for fabricating a light emitting device configured as a Group III-nitride based laser device, the method comprising:
   providing a substrate member comprising a gallium and nitrogen containing material and a surface region;
   forming a gallium containing epitaxial material overlying the surface region;
   forming a first p-type (Al,In,Ga)N waveguiding material overlying the gallium containing epitaxial material under a first predetermined process condition;
   maintaining the first predetermined process condition such that an environment surrounding a growth of the first p-type (Al,In,Ga)N waveguiding material is substantially molecular N$_2$ rich gas environment;
   maintaining a temperature ranging from 725 C to 925 C during the formation of the first p-type (Al,In,Ga)N waveguiding material; and
   forming a second p-type (Al,In,Ga)N waveguiding material overlying the gallium containing epitaxial material under a second predetermined process condition;
   wherein the first predetermined process condition is substantially free from molecular H$_2$ gas;
   wherein the second predetermined process condition comprises a non-substantially molecular N$_2$ rich gas environment.

22. A method for fabricating a light emitting device configured as a Group III-nitride based laser device, the method comprising:
   providing a substrate member comprising a gallium and nitrogen containing material and a surface region;
   forming a gallium containing epitaxial material overlying the surface region;
   forming a p-type (Al,In,Ga)N waveguiding material overlying the gallium containing epitaxial material under a predetermined process condition, the predetermined process condition being substantially free from molecular H$_2$ gas;
   maintaining the predetermined process condition such that an environment during a growth of the p-type (Al,In,Ga)N waveguiding material is substantially molecular N$_2$ rich gas environment, while maintaining a temperature ranging from 725 C to 925 C during the formation of the p-type (Al,In,Ga)N waveguiding material; and further comprising forming an n-type gallium nitride material below the p-type (Al,In,Ga)N waveguiding material, the p-type (Al,In,Ga)N waveguiding material configured as a cladding region;

forming an active region overlying the gallium containing epitaxial material, the active region comprising of a plurality of quantum-well regions, each of the quantum-well regions being configured with a barrier material;

forming a p-type (Al,In,Ga)N p-type electron blocking layer overlying the active region;

wherein the p-type (Al,In,Ga)N waveguiding material is grown under the predetermined process condition consisting of the substantially molecular $N_2$ rich gas environment and a molecular $H_2$ to $N_2$ gas flow ratio of less than 1 to 10; wherein the p-type (Al,In,Ga)N waveguiding material is grown within the temperature range during the predetermined process condition; wherein the p-type (Al,In,Ga)N waveguiding material is characterized by a carbon impurity concentration of less than 1E17 atoms per cubic centimeter when grown within the temperature range; and wherein the p-type (Al,In,Ga)N waveguiding material is formed using a trimethylgallium metallorganic precursor and/or a triethylgallium metallorganic precursor with a growth rate greater than 0.75 angstroms per second and less than 5.0 angstroms per second; wherein the p-type (Al,In,Ga)N waveguiding material is formed at the predetermined process condition including an ammonia containing species, whereupon the ammonia containing species to molecular $N_2$ gas ratio is greater than 1:5 but less than 2:3; and wherein the substrate is configured on a nonpolar (10-10), (11-20), or a related miscut orientation or wherein the substrate is configured on polar (0001) or (000-1), or a related miscut orientation or wherein the substrate is configured on a semipolar (20-21), (20-2-1), (30-31), (30-3-1), (11-22), or a related miscut orientation.

* * * * *